(12) United States Patent
Lien

(10) Patent No.: US 6,570,405 B1
(45) Date of Patent: May 27, 2003

(54) INTEGRATED OUTPUT DRIVER CIRCUITS HAVING CURRENT SOURCING AND CURRENT SINKING CHARACTERISTICS THAT INHIBIT POWER BOUNCE AND GROUND BOUNCE

(75) Inventor: Chuen-Der Lien, Los Altos Hills, CA (US)

(73) Assignee: Integrated Device Technology, Inc., Santa Clara, CA (US)

( * ) Notice: Subject to any disclaimer, the term of this patent is extended or adjusted under 35 U.S.C. 154(b) by 0 days.

(21) Appl. No.: 10/028,746

(22) Filed: Dec. 20, 2001

(51) Int. Cl.[7] .................................................. H03K 19/0175
(52) U.S. Cl. ................................................. 326/83; 326/86
(58) Field of Search ..................................... 326/83, 86, 88

(56) References Cited

U.S. PATENT DOCUMENTS

| 4,933,574 A | | 6/1990 | Lien et al. |
| 4,972,100 A | * | 11/1990 | Lim et al. ..................... 326/33 |
| 5,008,568 A | | 4/1991 | Leung et al. |
| 5,028,818 A | | 7/1991 | Go Ang et al. |
| 5,173,627 A | | 12/1992 | Lien |
| 5,293,082 A | * | 3/1994 | Bathaee ..................... 326/121 |
| 5,313,435 A | * | 5/1994 | Kim et al. ..................... 326/95 |
| 5,430,404 A | | 7/1995 | Campbell et al. |
| 5,568,062 A | | 10/1996 | Kaplinsky |
| 5,656,960 A | | 8/1997 | Holzer |
| 6,130,563 A | | 10/2000 | Pilling et al. |
| 6,154,059 A | | 11/2000 | Cheung et al. |
| 6,184,729 B1 | | 2/2001 | Pasqualini |
| 6,242,942 B1 | | 6/2001 | Shamarao |

OTHER PUBLICATIONS

Sedra et al., "Microelectronic Circuits," 1982 CBS College Publishing, pp. 335–339.

* cited by examiner

*Primary Examiner*—Don Le
(74) *Attorney, Agent, or Firm*—Myers Bigel Sibley & Sajovec

(57) ABSTRACT

Integrated output driver circuits have sourcing and sinking current characteristics that reduce power (Vdd) and ground (Vss) bounce effects by making the dI/dt characteristic of the sourcing current to a load and/or sinking current from the load more nearly uniform during a pull-up or pull-down driving event. Improved speed characteristics can also be achieved using capacitive bootstrapping to quickly turn on a NMOS pull-down transistor, which controls the sinking current from the load, and/or PMOS pull-up transistor, which controls the sourcing current to the load.

56 Claims, 5 Drawing Sheets

US 6,570,405 B1

INTEGRATED OUTPUT DRIVER CIRCUITS HAVING CURRENT SOURCING AND CURRENT SINKING CHARACTERISTICS THAT INHIBIT POWER BOUNCE AND GROUND BOUNCE

FIELD OF THE INVENTION

The present invention relates to integrated circuit devices, and more particularly to integrated output driver circuits.

BACKGROUND OF THE INVENTION

Integrated circuits typically include output drivers therein for driving on-chip and off-chip loads. To reduce power (Vdd) bounce and ground (Vss) bounce problems in integrated circuits, circuit designers have developed techniques to slowly turn on the output drivers to minimize power and ground bounce effects. Such techniques typically result in a trade off between operating speed and power and ground bounce. One conventional technique for minimizing power and ground bounce in an output driver is illustrated by FIG. 1. The output driver of FIG. 1 includes an NMOS pull-down transistor N2 having a drain electrically coupled to an output OUT of the driver. When the NMOS pull-down transistor N2 is turned on, the output OUT is pulled low to Vss. When the NMOS pull-down transistor N2 is turned off, the output OUT is disposed in a high impedance state. The gate of the NMOS pull-down transistor N2 is controlled by a driver control circuit. This control circuit includes a totem pole arrangement of a PMOS pull-up transistor P1, a resistor R1 and an NMOS pull-down transistor N1, connected as illustrated. A gate of the PMOS pull-up transistor P1 and a gate of the NMOS pull-down transistor N1 are electrically connected together and responsive to an input signal IN.

In the output driver of FIG. 1, the resistor R1 is included in order to slow down the rate at which the NMOS pull-down transistor N2 is turned on in response to a logic 0 input signal IN. The inclusion of the resistor R1 slows down the driver by slowing down the rate at which the voltage at the gate of NMOS pull-down transistor N2 transitions from 0 volts to Vth volts (where Vth is the threshold voltage of the NMOS pull-down transistor N2). However, the inclusion of the resistor R1 does not significantly improve the ground bounce characteristics of the driver. The slow down in speed of the driver is particularly serious when Vdd is relatively low. In contrast, when Vdd is high, the sinking current provided by resistor R1 increases and causes the voltage at the gate of the NMOS pull-down transistor N2 to ramp up faster and this increases ground bounce. Thus, the use of a resistor makes speed slower at low Vdd and ground bounce greater at high Vdd. Moreover, at low temperature, the sinking current through resistor R1 increases (because the resistance of resistor R1 decreases) and the drain-to-source current through the NMOS pull-down transistor N2 increases. This makes ground bounce worse at lower temperatures and speed slower at high temperatures. What is needed, therefore, are driver circuits having excellent ground and Vdd bounce characteristics that are at least substantially independent of changes in Vdd and temperature.

SUMMARY OF THE INVENTION

Integrated output driver circuits according to embodiments of the present invention have sourcing and sinking current characteristics that reduce power (Vdd) and ground (Vss) bounce effects by making the dI/dt characteristic of the sourcing current to a load and/or sinking current from the load more nearly uniform and substantially independent of Vdd and temperature. Improved speed characteristics can also be achieved using capacitive bootstrapping to quickly turn on an NMOS pull-down transistor, which controls the sinking current from the load, and/or PMOS pull-up transistor, which controls the sourcing current to the load.

In particular, an integrated driver circuit according to one embodiment of the present invention includes a first driver transistor and an output signal line electrically coupled to a first current carrying terminal of the first driver transistor. The first driver transistor may be an NMOS pull-down transistor having a drain connected to the output signal line and a source electrically coupled to a reference power supply line (e.g., Vss). The first driver transistor may also be a PMOS pull-up transistor having a drain connected to the output signal line and a source electrically coupled to a positive power supply line (e.g., Vdd). The driver circuit also includes a preferred driver control circuit. According to one aspect of this embodiment, the driver control circuit has a switchable pull-up path therein that extends between a gate of the first driver transistor and the positive power supply line. This switchable pull-up path includes a depletion mode transistor (NMOS or PMOS) having a first current carrying terminal electrically coupled to the gate of the first driver transistor. The depletion mode transistor may be a buried channel device. The gate and the first current carrying terminal of the depletion mode transistor are electrically connected together. The switchable pull-up path may also include a PMOS pull-up transistor having a drain electrically coupled to a second current carrying terminal of the depletion mode transistor and a source electrically coupled to the positive power supply line.

To improve speed characteristics, a bootstrap capacitor is provided having a first electrode electrically connected to the second current carrying terminal of the depletion mode transistor and a second electrode electrically connected to the first current carrying terminal of the depletion mode transistor. In particular, preferred high speed characteristics can be achieved by sizing the capacitor so that its capacitance is in a range between about 0.75 and 1.25 times $C_{ideal}$, where $C_{ideal}=|Vth|(Cin)/(Vdd-|Vth|)$, Vth is a threshold voltage of the NMOS pull-down transistor, Cin is an input capacitance of the NMOS pull-down transistor and Vdd represents a magnitude of a power supply voltage applied to the positive power supply line. The on-state characteristics of the depletion mode transistor are also chosen so that its $I_{dsat}$ characteristic has a right positive temperature coefficient (i.e., $dI_{dsat}/dT$ is positive). The value of the positive temperature coefficient is sufficient to at least substantially compensate for a reduction in majority carrier mobility in an N-type inversion layer channel of the NMOS pull-down transistor. This reduction in majority carrier mobility occurs in response to an increase in temperature over a first operating temperature range. According to another embodiment of the present invention, the driver control circuit has a switchable pull-down path that extends between the gate of the first driver transistor and the reference power supply line. This switchable pull-down path includes a depletion mode transistor having a first current carrying terminal electrically coupled to the gate of the first driver transistor, which is preferably a PMOS pull-up transistor.

Still further embodiments of an integrated driver circuit include a first NMOS pull-down transistor and a first PMOS pull-up transistor connected together in a totem pole arrangement that extends between a positive power supply line and a reference power supply line. A gate of the first NMOS pull-down transistor and a gate of the first PMOS pull-up transistor may be connected together or independently controllable in the event a high impedance output condition is desired. A first driver control circuit is provided having a switchable pull-up path therein that extends between a gate of the first NMOS pull-down transistor and the positive power supply line. This pull-up path includes a first depletion mode transistor having a first current carrying terminal electrically coupled to the gate of the first NMOS pull-down transistor. The first depletion mode transistor may be a PMOS or NMOS depletion mode transistor having its gate and source terminals connected together. A second driver control circuit is also provided having a switchable pull-down path therein that extends between a gate of the first PMOS pull-up transistor and the reference power supply line. This pull-down path includes a second depletion mode transistor having a first current carrying terminal electrically coupled to the gate of the first PMOS pull-up transistor.

The first and second depletion mode transistors are preferably buried channel devices having improved mobility characteristics resulting from reduced $Si/SiO_2$ interface scattering. It is also preferred that these buried channel devices have a peak channel dopant concentration therein at a level of about $1 \times 10^{18}$ cm$^{-3}$ or less to reduce phonon scattering and impurity scattering. To achieve preferred device characteristics by reducing ground bounce, the $1_{dsat(NMOS)}$ characteristics of the NMOS pull-down transistor should be made independent of temperature. This can be achieved by designing the first depletion mode transistor to compensate for reductions in mobility (and reductions in $1_{dsat(NMOS)}$) within the NMOS pull-down transistor. In particular, the first depletion mode transistor is designed to have temperature dependent $1_{dsat}$ characteristic that meets the following relationship over at least a first portion of an operating temperature range: $0.005 \leq \partial 1_{dsat}/\partial T \leq 0.015$, where T designates a temperature (° C.) within the operating temperature range. This temperature dependent characteristic of the first depletion mode transistor can be used to compensate for an NMOS pull-down transistor having a temperature dependent $1_{dsat(NMOS)}$ characteristic that meets the following relationship over at least a second portion of the operating temperature range: $-0.01 \geq \partial 1_{dsat(NMOS)}/\partial T \geq -0.015$.

The switchable pull-up path also includes a second PMOS pull-up transistor having a drain electrically connected to a second current carrying terminal of the first depletion mode transistor and a source electrically connected to the positive power supply line. The switchable pull-down path also includes a second NMOS pull-down transistor having a drain electrically connected to a second current carrying terminal of the second depletion mode transistor and a source electrically connected to the reference power supply line. A third NMOS pull-down transistor is provided that is electrically coupled to the pull-up path. The third NMOS pull-down transistor preferably has a drain electrically connected to the first current carrying terminal of the first depletion mode transistor. A third PMOS pull-up transistor is provided that is electrically coupled to the pull-down path. The third PMOS pull-up transistor preferably has a drain electrically connected to the first current carrying terminal of the second depletion mode transistor. A gate of the third NMOS pull-down transistor and a gate of the second PMOS pull-up transistor may be electrically connected together and responsive to a first input signal. A gate of the third PMOS pull-up transistor and a gate of the second NMOS pull-down transistor may be electrically connected together and responsive to a second input signal.

To improve speed characteristics, first and second bootstrap capacitors are provided. The first bootstrap capacitor has a first electrode electrically connected to a second current carrying terminal of the first depletion mode transistor and a second electrode electrically connected to the first current carrying terminal of the first depletion mode transistor. The second bootstrap capacitor has a first electrode electrically connected to a second current carrying terminal of the second depletion mode transistor and a second electrode electrically connected to the first current carrying terminal of the second depletion mode transistor. The first and second bootstrap capacitors are preferably sized to achieve fast turn on of the first NMOS pull-down transistor and first PMOS pull-up transistor, respectively.

DESCRIPTION OF PREFERRED EMBODIMENTS

The present invention will now be described more fully hereinafter with reference to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art. Like numbers refer to like elements throughout and signal lines and signals thereon may be referred to by the same reference symbols.

Figure 1:
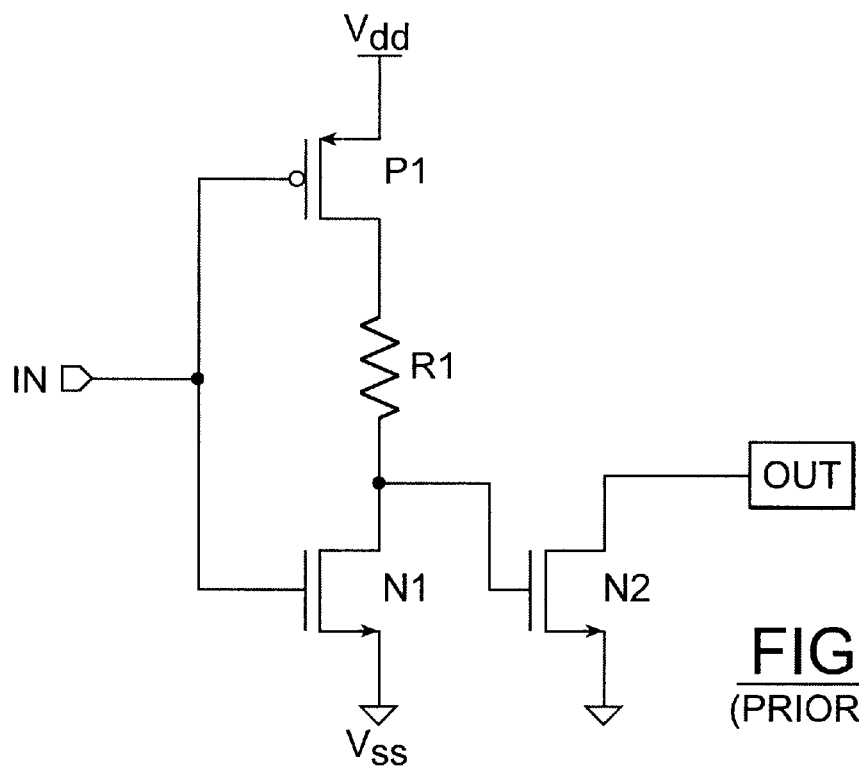
FIG. 1 is an electrical schematic of a conventional integrated driver circuit.
Figure 2:
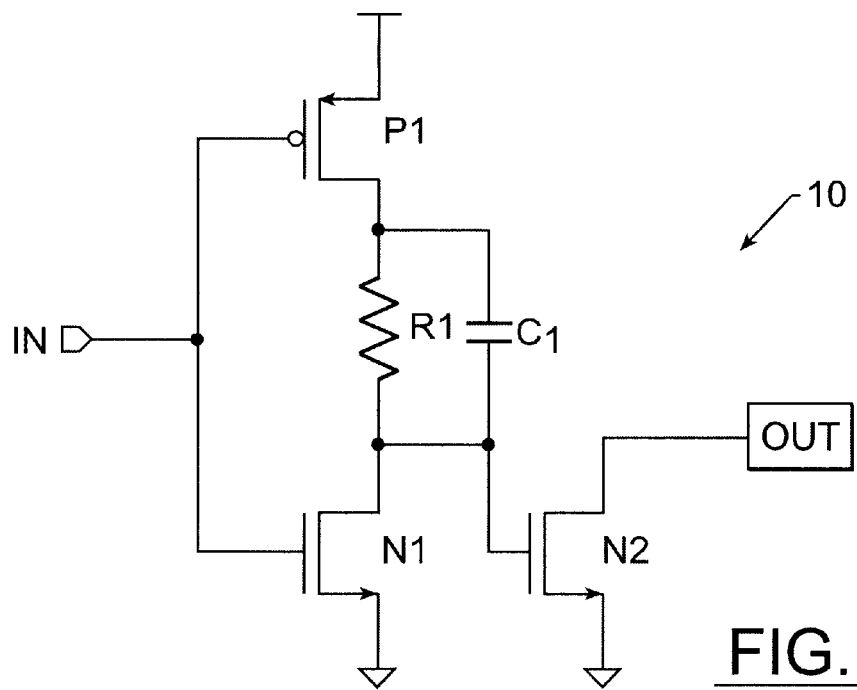
FIG. 2 is an electrical schematic of an integrated driver circuit according to a first embodiment of the present invention.

Referring now to FIG. 2, an output driver circuit 10 according to one embodiment of the present invention includes an NMOS pull-down transistor N2 as a first driver transistor and a driver control circuit that controls turn on and turn off of the first driver transistor. The driver control circuit includes a pull-up path defined by a PMOS pull-up transistor P1 in series with a resistor R1. Additional elements may be provided in the pull-up path and one or more of these elements may extend between the resistor R1 and the drain of the PMOS pull-up transistor P1. As illustrated, the pull-up path extends between the positive power supply line (e.g., Vdd) and the gate of the NMOS pull-down transistor N2. An NMOS pull-down transistor N1 is also provided at the bottom of the pull-up path, as illustrated. A gate of the NMOS pull-down transistor N1 and a gate of the PMOS pull-up transistor P1 are electrically connected together and responsive to an input signal IN. An output OUT of the driver circuit 10 can be disposed in a high impedance state or pulled low to a ground reference potential (e.g., Vss). A bootstrap capacitor C1 is provided in a pull-up path to increase the speed at which the NMOS pull-down transistor N2 turns on when the PMOS pull-up transistor P1 turns on in response to a logic 0 input signal IN. In particular, the bootstrap capacitor C1 is provided to quickly pull-up the gate of the NMOS pull-down transistor N2 to a voltage level of at least about Vth, where Vth is the threshold voltage of the NMOS pull-down transistor N2. To achieve preferred high speed characteristics, the bootstrap capacitor C1 can be sized so that its capacitance is in a range between about 0.75 and 1.25 times $C_{ideal}$, where $C_{ideal}=|Vth|(Cin)/(Vdd-|Vth|)$, Vth is a threshold voltage of the NMOS pull-down transistor N2, Cin is an input capacitance of the NMOS pull-down transistor N2 and Vdd represents a magnitude of a power supply voltage applied to the positive power supply line (e.g., Vdd).

Figure 3:
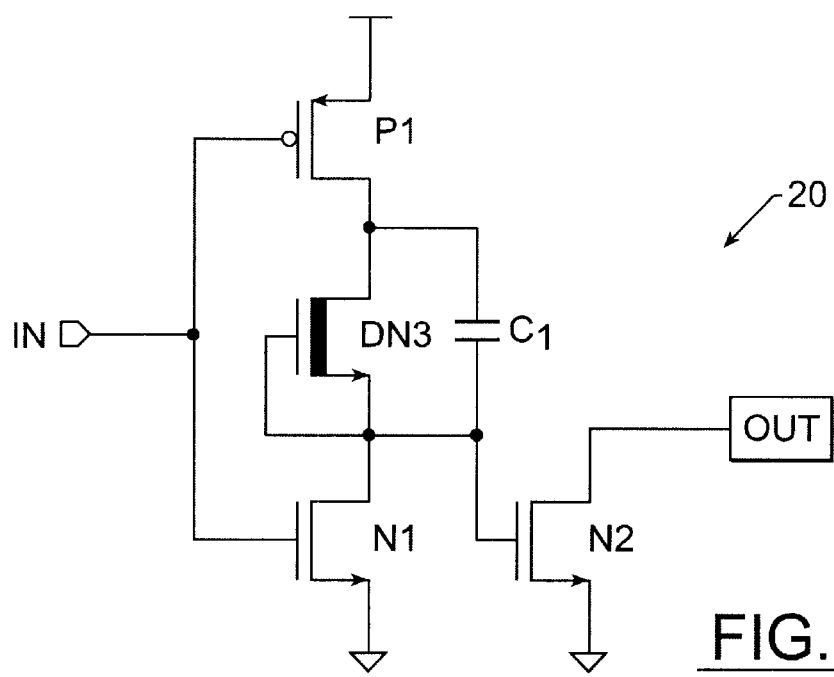
FIG. 3 is an electrical schematic of an integrated driver circuit according to a second embodiment of the present invention.
Figure 6:
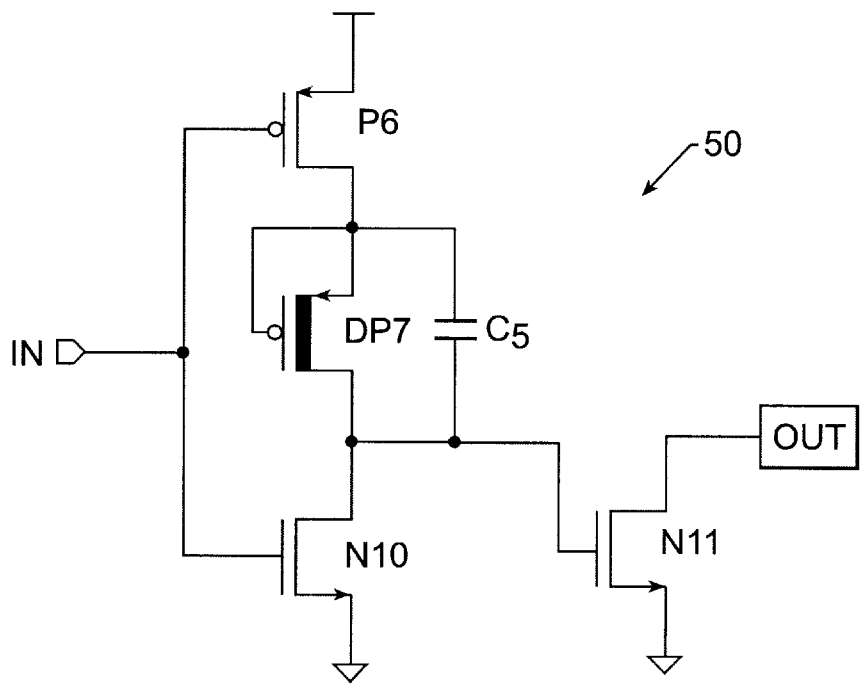
FIG. 6 is an electrical schematic of an integrated driver circuit according to a fifth embodiment of the present invention.
Figure 8A:
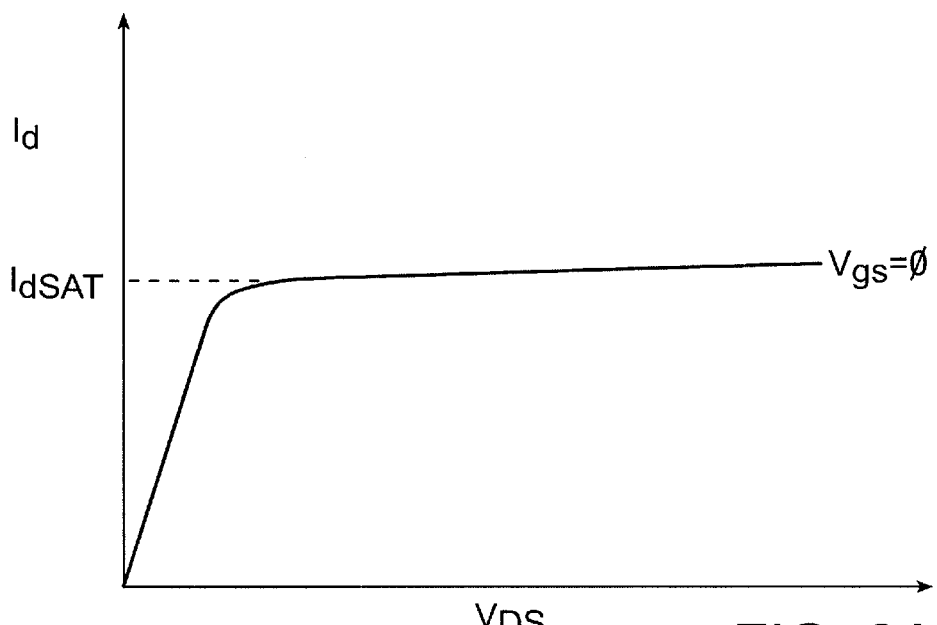
FIG. 8A is a graph illustrating drain current (Id) versus drain-to-source voltage for an N-channel depletion mode MOSFET.

As illustrated by the driver circuit 20 of FIG. 3, it is preferable that the resistor R1 of FIG. 2 be replaced by an NMOS depletion mode transistor DN3 that can be designed to supply a more uniform displacement current to the gate of the NMOS pull-down transistor N2. The NMOS depletion mode transistor DN3 may be replaced by a PMOS depletion mode transistor DP7, as illustrated by FIG. 6. By connecting the gate and source of the NMOS depletion mode transistor DN3 together so that Vgs(DN3)=0 volts, the displacement current provided to the MOS capacitor defined between the gate of NMOS pull-down transistor N2 and the source, channel (body) and drain regions of NMOS pull-down transistor N2, becomes substantially independent of changes in the power supply voltage Vdd. This is because the saturated drain current ($I_{dsat}$) through the NMOS depletion mode transistor DN3 stays relatively constant, notwithstanding changes in Vds(DN3). This relative independence between Idsat and Vds is illustrated by FIG. 8A, which is a graph illustrating drain current (Id) versus drain-to-source voltage for an N-channel depletion mode MOSFET (at Vgs=0 volts). The driver circuit 20 also preferably includes a bootstrap capacitor C1 to increase the speed at which the NMOS pull-down transistor N2 turns on in response to turn on of the PMOS pull-up transistor P1. Like the driver circuit 10 of FIG. 2, the output OUT of the driver circuit 20 of FIG. 3 can be disposed in a high impedance state (when the input signal IN switches high to a logic 1 level) or pulled low to a ground reference potential (e.g., Vss) (when the input signal IN switches low to a logic 0 level).

The driver circuit 50 of FIG. 6 is similar to the driver circuit 20 of FIG. 3, however, the NMOS depletion mode transistor DN3 of FIG. 3 has been replaced by a PMOS depletion mode transistor DP7. In particular, the driver circuit 50 of FIG. 6 includes an NMOS pull-down transistor N11 that drives an output OUT and a pull-up path that drives a gate of the NMOS pull-down transistor N11. The pull-up path includes a PMOS depletion mode transistor DP7 having a first current carrying terminal (e.g., drain) that is electrically connected to the gate of the NMOS pull-down transistor N11. A gate and a second current carrying terminal (e.g., source) of the PMOS depletion mode transistor DP7 are connected together. A PMOS pull-up transistor P6 is also provided in the pull-up path. A drain of the PMOS pull-up transistor P6 is electrically connected to the second current carrying terminal of the PMOS depletion mode transistor DP7 and a source of the PMOS pull-up transistor P6 is connected to a positive power supply line Vdd, as illustrated. A bootstrap capacitor C5 is also provided. The bootstrap capacitor C5 has first and second electrodes connected to the first and second current carrying terminals of the PMOS depletion mode transistor DP7, respectively. To achieve preferred high speed characteristics, the bootstrap capacitor C5 can be sized so that its capacitance is in a range between about 0.75 and 1.25 times $C_{ideal}$, where $C_{ideal}=|Vth|(Cin)/(Vdd-|Vth|)$, Vth is a threshold voltage of the NMOS pull-down transistor N11, Cin is an input capacitance of the NMOS pull-down transistor N11 and Vdd represents a magnitude of a power supply voltage applied to the positive power supply line (e.g., Vdd).

NMOS pull-down transistor N10 is also included at a bottom of the pull-up path. As illustrated, a drain of the NMOS pull-down transistor N10 is connected to the first current carrying terminal of the PMOS depletion mode transistor DP7 and a source of the NMOS pull-down transistor N10 is connected to a reference power supply line Vss. A gate of the NMOS pull-down transistor N10 and a gate of the PMOS pull-up transistor P6 are connected together and responsive to an input signal IN. When the input signal IN is driven high to a logic 1 level, NMOS pull-down transistor N10 turns on to pull the gate of NMOS pull-down transistor N11 low and dispose the output OUT in a high impedance state. Alternatively, when the input signal IN is driven low to a logic 0 level, the PMOS pull-up transistor P6 turns on to pull the second current carrying terminal (and gate) of PMOS depletion mode transistor DP7 high to a logic 1 level. The bootstrapping function provided by bootstrap capacitor C5 will quickly pull the gate of NMOS pull-down transistor N11 to Vth. Here, the bootstrap capacitor C5 and the MOS capacitor defined at the input of the NMOS pull-down transistor N11 operate as pair of capacitors that are electrically connected in series between the positive power supply line Vdd and the reference power supply line Vss.

Figure 4:
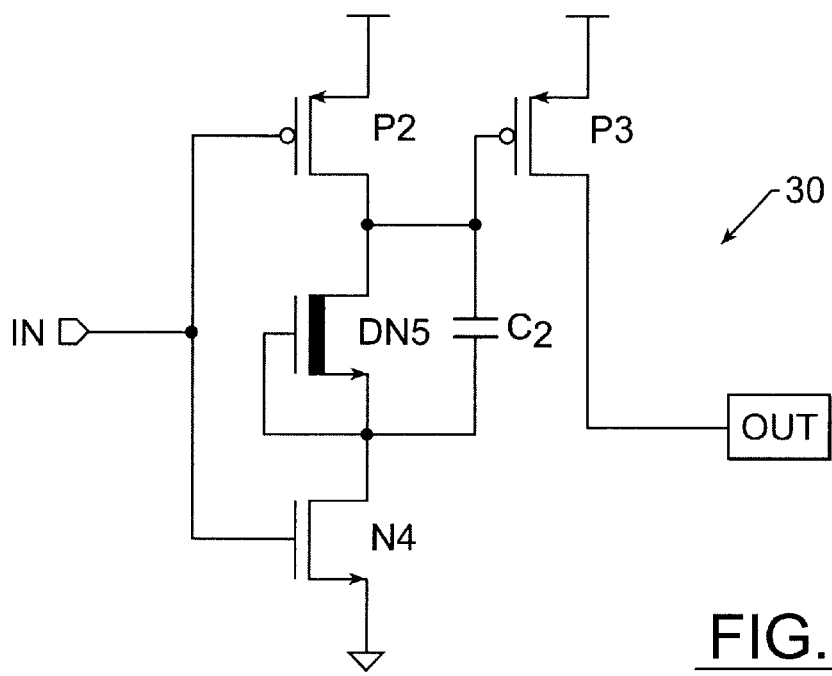
FIG. 4 is an electrical schematic of an integrated driver circuit according to a third embodiment of the present invention.

Referring now to FIG. 4, an output driver circuit 30 according to another embodiment of the present invention includes a first driver transistor and a pull-down path that drives a gate of the first driver transistor. The first driver transistor is illustrated as a PMOS pull-up transistor P3 having a source electrically coupled to a positive power supply line and a drain electrically coupled to an output signal line OUT. A gate of the PMOS pull-up transistor P3 is electrically connected to a first current carrying terminal of an NMOS depletion mode transistor DN5. This NMOS depletion mode transistor DN5 may be a buried channel device. The pull-down path also includes an NMOS pull-down transistor N4 having a drain electrically connected to a second current carrying terminal of the NMOS depletion mode transistor DN5. The gate and source of the NMOS depletion mode transistor DN5 are electrically connected together. A bootstrap capacitor C2 is also provided across the first and second current carrying terminals of the NMOS depletion mode transistor DN5. This bootstrap capacitor C2 can be sized so that its capacitance is in a range between about 0.75 and 1.25 times $C_{ideal}$, where $C_{ideal}=|Vth|(Cin)/(Vdd-|Vth|)$, Vth is a threshold voltage of the PMOS pull-up transistor P3, Cin is an input capacitance of the PMOS pull-up transistor P3 and Vdd represents a magnitude of a power supply voltage applied to the positive power supply line (e.g., Vdd).

A PMOS pull-up transistor P2 is provided between the first current carrying terminal of the NMOS depletion mode transistor DN5 and the positive power supply line. A gate of the PMOS pull-up transistor P2 and a gate of the NMOS pull-down transistor N4 are electrically connected together and responsive to an input signal IN. When the input signal IN is driven to a logic 0 level, the PMOS pull-up transistor P2 turns on and pulls the gate of the PMOS pull-up transistor P3 to a logic 1 level, thereby disposing the output OUT in a high impedance state. In contrast, when the input signal IN is driven to a logic 1 level, the NMOS pull-down transistor N4 turns on. By capacitive coupling, the bootstrap capacitor C2 quickly pulls the gate of PMOS pull-up transistor P3 sufficiently low to enable turn on of the PMOS pull-up transistor P3. In particular, the size of the bootstrap capacitor C2 relative to the MOS input capacitance of the PMOS pull-up transistor P3 is chosen so that the gate of the PMOS pull-up transistor P3 is pulled quickly to a level of less than about Vdd−|Vth|, where Vth is a threshold voltage of the PMOS pull-up transistor P3. Furthermore, the on-state characteristics of the NMOS depletion mode transistor DN5 are also chosen so that its $I_{dsat}$ characteristic has a right positive temperature coefficient (i.e., $dI_{dsat}/dT$ is positive). The value of the positive temperature coefficient, which causes the gate of PMOS pull-up transistor P3 to be charged faster, is sufficient to at least substantially compensate for a reduction in majority carrier mobility in an P-type inversion layer channel of the PMOS pull-up transistor P3. This reduction in majority carrier mobility occurs in response to an increase in temperature over a first operating temperature range.

Figure 5:
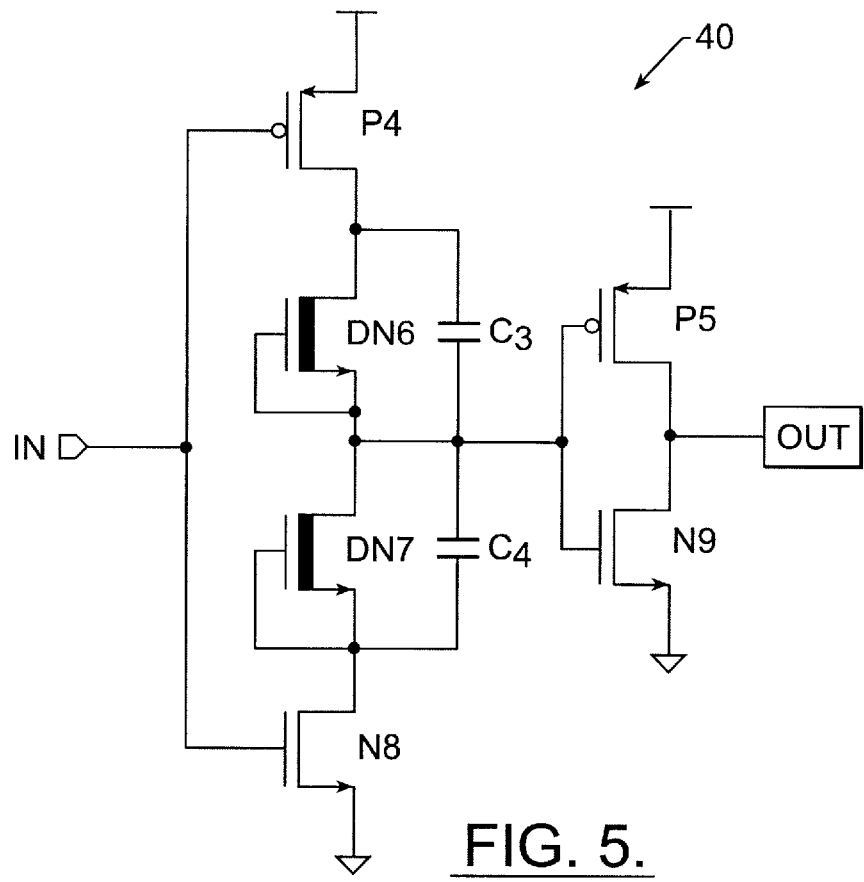
FIG. 5 is an electrical schematic of an integrated driver circuit according to a fourth embodiment of the present invention.

The output driver circuit 40 of FIG. 5 includes a CMOS inverter defined by an NMOS pull-down transistor N9 and a PMOS pull-up transistor P5, connected as illustrated. The input of the CMOS inverter is connected to a first current carrying terminal of NMOS depletion mode transistor DN6 and a first current carrying terminal of NMOS depletion mode transistor DN7. A pull-up path is provided by the NMOS depletion mode transistor DN6 and a PMOS pull-up transistor P4. A pull-down path is provided by the NMOS depletion mode transistor DN7 and NMOS pull-down transistor N8. As illustrated, a gate of the NMOS pull-down transistor N8 and a gate of the PMOS pull-up transistor P4 are connected together and responsive to an input signal IN. A first bootstrap capacitor C3 and a second bootstrap capacitor C4 are connected across the NMOS depletion mode transistors DN6 and DN7, respectively. These NMOS depletion mode transistors DN6 and DN7 may be buried channel transistors and may be replaced by PMOS depletion mode transistors in an alternative embodiment. When the input signal IN provided to the output driver circuit 40 transitions to a logic 1 voltage level, the NMOS pull-down transistor N8 turns on and through capacitive bootstrapping quickly pulls down the gate of PMOS pull-up transistor P5 to a level sufficient to turn on the PMOS pull-up transistor P5. The depletion mode transistor DN7 provides a substantially uniform current sinking characteristic that lowers a voltage at an input of the CMOS inverter in a manner that inhibits Vdd bounce. Alternatively, when the input signal IN provided to the output driver circuit 40 transitions from a logic 1 voltage level to a logic 0 voltage level, the PMOS pull-down transistor P4 turns on and through capacitive bootstrapping quickly pulls up the gate of NMOS pull-down transistor N9 to a level sufficient to turn on the NMOS pull-down transistor N9. The depletion mode transistor DN6 also provides a substantially uniform current sourcing characteristic that raises a voltage at an input of the CMOS inverter in a manner that inhibits Vss bounce.

Figure 7:
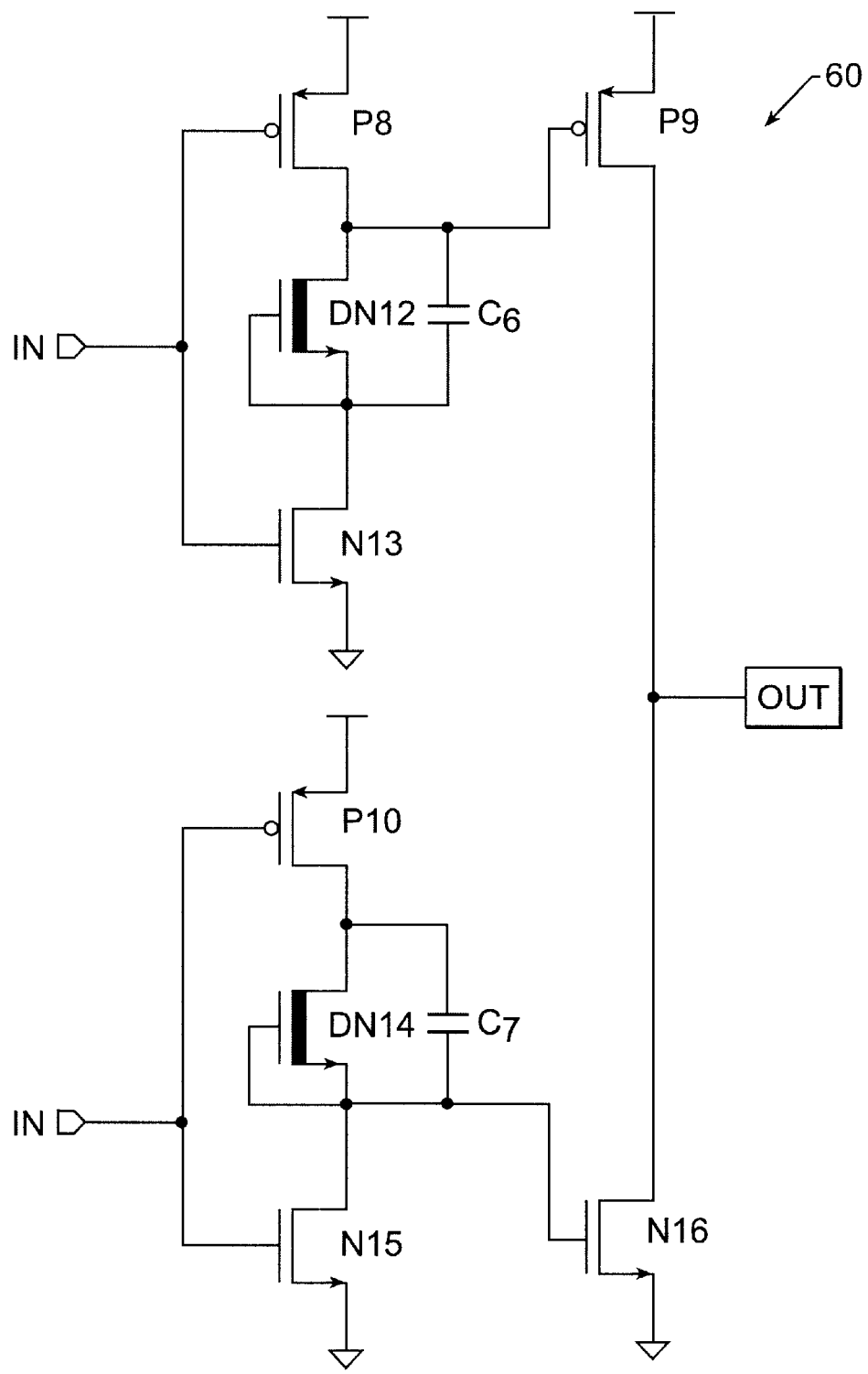
FIG. 7 is an electrical schematic of an integrated driver circuit according to a sixth embodiment of the present invention.

Referring now to FIG. 7, an output driver circuit 60 according to another embodiment of the present invention is similar to the driver circuit 40 of FIG. 5, however, the CMOS inverter at the output stage of the driver circuit 40 of FIG. 5 is replaced by independently controllable PMOS and NMOS transistors that provide a high impedance output state. In particular, the output driver circuit 60 of FIG. 7 includes a PMOS pull-up transistor P9 that is driven by a first driver control circuit 62a. The first driver control circuit 62a, which is similar to the driver control circuit of FIG. 4, includes a pull-down path defined by an NMOS depletion mode transistor DN12 in series with an NMOS pull-down transistor N13. A bootstrap capacitor C6 is also provided across the current carrying terminals of the NMOS depletion mode transistor DN12. A PMOS pull-up transistor P8 is also provided to turn off the PMOS pull-up transistor P9 when a second input signal IN2 is driven low. The output driver circuit 60 of FIG. 7 also includes an NMOS pull-down transistor N16 that is driven by a second driver control circuit 62b. The second driver control circuit 62b, which is similar to the driver control circuit of FIG. 3, includes a pull-up path defined by an NMOS depletion mode transistor DN14 in series with an PMOS pull-up transistor P10. A bootstrap capacitor C7 is also provided across the current carrying terminals of the NMOS depletion mode transistor DN14. An NMOS pull-down transistor N15 is also provided to turn off the NMOS pull-down transistor N16 when a first input signal IN2 is driven high.

The NMOS depletion mode transistors DN12 and DN14 are preferably buried channel devices having improved mobility characteristics resulting from reduced $Si/SiO_2$ interface scattering. It is also preferred that these buried channel devices have a peak channel dopant concentration therein at a level of about $1 \times 10^{18}$ cm$^{-3}$ or less to reduce phonon scattering and impurity scattering. To achieve preferred device characteristics by reducing ground bounce, the $I_{dsat(NMOS)}$ characteristics of the NMOS pull-down transistor N16 should be made independent of temperature. This can be achieved by designing the depletion mode transistor DN14 to compensate for reductions in mobility (and reductions in $I_{dsat(NMOS)}$) within the NMOS pull-down transistor N16. In particular, the depletion mode transistor DN14 is designed to have temperature dependent $I_{dsat}$ characteristic that meets the following relationship over at least a first portion of an operating temperature range:

$$0.005 \leq \partial I_{dsat}/\partial T \leq 0.015 \tag{1}$$

where T designates a temperature (° C.) within the operating temperature range. This temperature dependent characteristic of the depletion mode transistor DN14 can be used to compensate for an NMOS pull-down transistor N16 having a temperature dependent $I_{dsat(NMOS)}$ characteristic that meets the following relationship over at least a second portion of the operating temperature range:

$$-0.01 \geq \partial I_{dsat(NMOS)}/\partial T \geq -0.015 \tag{2}$$

Figure 8B:
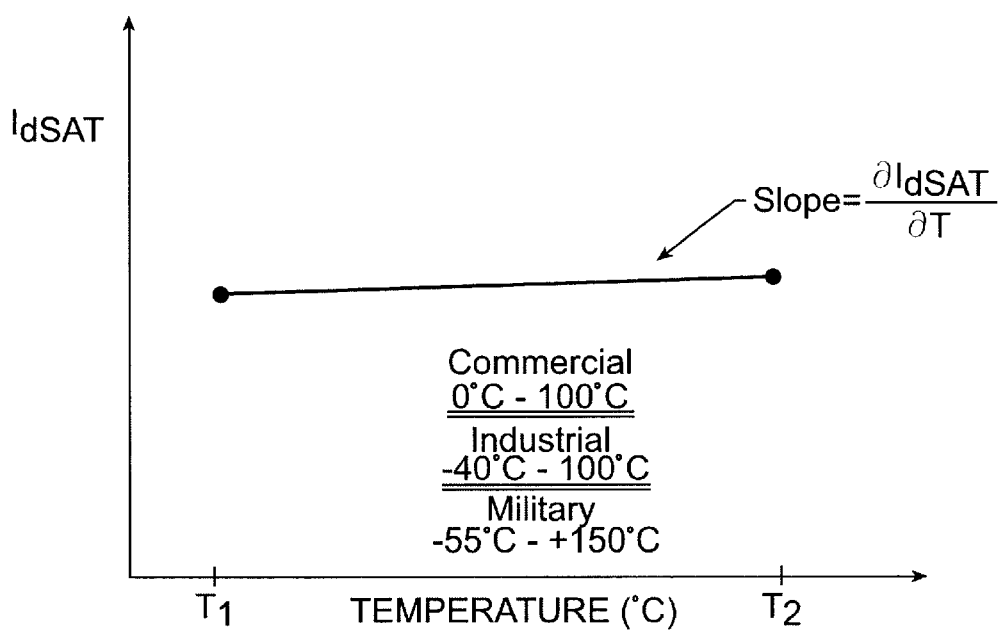
FIG. 8B is a graph illustrating saturated drain current versus temperature for an N-channel depletion mode MOSFET.

From a gate control point of view, $I_{dsat(NMOS)}$ is proportional to $(Vg-Vth)^N$, where $1 \leq N \leq 2$, where Vg is the voltage at the gate of the NMOS pull-down transistor N16. Accordingly, $I_{dsat(NMOS)}$ is proportional to $(\exp(-\alpha T))(Vg-Vth)^N$, where $\alpha$ is defined as $\partial I_{dsat(NMOS)}/\partial T$. To keep $I_{dsat(NMOS)}$ independent of temperature, the difference Vg−Vth should be made proportional to $\exp(\alpha T/N)$. This implies that $(\partial(Vg-Vth)/\partial T)/(Vg-Vth) = \alpha/N$. Because Vg is roughly proportional to $I_{dsat}$ of the depletion mode transistor DN14, then it is preferably that $\partial I_{dsat}/\partial T$, which is approximately equal to α/N, fall within the range defined by equation (1). The relationship between $I_{dsat}$ and T is graphically illustrated by FIG. 8B, over an operating temperature range between $T_1$ and $T_2$, where $T_1$ is no less than about −40° C. and $T_2$ is no greater than about 100° C.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. An integrated driver circuit, comprising:
   a first driver transistor;
   an output signal line electrically coupled to a first current carrying terminal of said first driver transistor;
   a driver control circuit having a switchable pull-up path therein that extends between a gate of said first driver transistor and a positive power supply line and comprises a depletion mode transistor having a first current carrying terminal electrically coupled to the gate of said first driver transistor; and
   a capacitor having a first electrode electrically connected to a second current carrying terminal of the depletion mode transistor and a second electrode electrically connected to the first current carrying terminal of the depletion mode transistor.

2. The driver circuit of claim 1, wherein said first driver transistor is an NMOS pull-down transistor; and wherein the switchable pull-up path comprises a PMOS pull-up transistor having a drain electrically coupled to the second current carrying terminal of the depletion mode transistor.

3. The driver circuit of claim 1, wherein said first driver transistor is an NMOS pull-down transistor; and wherein the switchable pull-up path comprises a PMOS pull-up transistor having a drain electrically coupled to the second current carrying terminal of the depletion mode transistor and a source electrically coupled to the positive power supply line.

4. The driver circuit of claim 2, wherein a gate and the first current carrying terminal of the depletion mode transistor are electrically coupled together.

5. The driver circuit of claim 4, wherein the depletion mode transistor is an NMOS depletion mode MOSFET.

6. The driver circuit of claim 2, wherein a gate and the second current carrying terminal of the depletion mode transistor are electrically coupled together.

7. The driver circuit of claim 6, wherein the depletion mode transistor is a PMOS depletion mode MOSFET.

8. The driver circuit of claim 1, wherein the depletion mode transistor is a buried channel MOSFET.

9. The driver circuit of claim 2, wherein the depletion mode transistor is a buried channel MOSFET.

10. The driver circuit of claim 2, wherein a capacitance of said capacitor is in a range between about 0.75 and 1.25 times $C_{ideal}$, where $C_{ideal}=|Vth|(Cin)/(Vdd-|Vth|)$, Vth is a threshold voltage of the NMOS pull-down transistor, Cin is an input capacitance of the NMOS pull-down transistor and Vdd represents a magnitude of a power supply voltage applied to the positive power supply line; and wherein the input capacitance of the NMOS pull-down transistor is measured between its gate and its source, drain and body regions.

11. The driver circuit of claim 1, wherein an $I_{dsat}$ characteristic of the depletion mode transistor has a positive temperature coefficient; and wherein a value of the positive temperature coefficient is sufficient to at least substantially compensate for a reduction in majority carrier mobility in a channel of said first driver transistor that occurs in response to an increase in temperature over a first operating temperature range.

12. An integrated driver circuit, comprising:
   a first driver transistor;
   an output signal line electrically coupled to a first current carrying terminal of said first driver transistor;
   a driver control circuit having a switchable pull-down path therein that extends between a gate of said first driver transistor and a reference power supply line and comprises a depletion mode transistor having a first current carrying terminal electrically coupled to the gate of said first driver transistor; and
   a capacitor having a first electrode electrically connected to a second current carrying terminal of the depletion mode transistor and a second electrode electrically connected to the first current carrying terminal of the depletion mode transistor.

13. The driver circuit of claim 12, wherein said first driver transistor is a PMOS pull-up transistor; and wherein the switchable pull-down path comprises an NMOS pull-down transistor having a drain electrically coupled to the second current carrying terminal of the depletion mode transistor.

14. The driver circuit of claim 12, wherein said first driver transistor is a PMOS pull-up transistor; and wherein the switchable pull-down path comprises an NMOS pull-down transistor having a drain electrically coupled to the second current carrying terminal of the depletion mode transistor and a source electrically coupled to the reference power supply line.

15. The driver circuit of claim 13, wherein a gate and the second current carrying terminal of the depletion mode transistor are electrically coupled together.

16. The driver circuit of claim 15, wherein the depletion mode transistor is an NMOS depletion mode MOSFET.

17. The driver circuit of claim 13, wherein the depletion mode transistor is a PMOS depletion mode transistor; and wherein a gate and the first current carrying terminal of the depletion mode transistor are electrically coupled together.

18. The driver circuit of claim 12, wherein the depletion mode transistor is a buried channel MOSFET.

19. The driver circuit of claim 13, wherein the depletion mode transistor is a buried channel MOSFET.

20. The driver circuit of claim 13, wherein a second current carrying terminal of said first driver transistor is electrically coupled to a positive power supply line; and wherein a capacitance of said capacitor is in a range between about 0.75 and 1.25 times $C_{ideal}$, where $C_{ideal}=|Vth|(Cin)/(Vdd-|Vth|)$, Vth is a threshold voltage of the PMOS pull-up transistor, Cin is an input capacitance of the PMOS pull-up transistor and Vdd represents a magnitude of a power supply voltage applied to the positive power supply line; and wherein the input capacitance of the PMOS pull-up transistor is measured between its gate and its source, drain and body regions.

21. An integrated driver circuit, comprising:
   a first NMOS pull-down transistor and a first PMOS pull-up transistor connected together in a totem pole arrangement that extends between a positive power supply line and a reference power supply line;
   a first driver control circuit having a switchable pull-up path therein that extends between a gate of said first NMOS pull-down transistor and the positive power supply line and comprises a first depletion mode transistor having a first current carrying terminal electrically coupled to the gate of said first NMOS pull-down transistor; and a second driver control circuit having a switchable pull-down path therein that extends between a gate of said first PMOS pull-up transistor and the reference power supply line and comprises a second depletion mode transistor having a first current carrying terminal electrically coupled to the gate of said first PMOS pull-up transistor; and wherein the gate of the first NMOS pull-down transistor is electrically connected to the gate of the first PMOS pull-up transistor.

22. The driver circuit of claim 21, wherein the switchable pull-up path comprises a second PMOS pull-up transistor having a drain electrically connected to a second current carrying terminal of the first depletion mode transistor and a source electrically connected to the positive power supply line; and wherein the switchable pull-down path comprises a second NMOS pull-down transistor having a drain electrically connected to a second current carrying terminal of the second depletion mode transistor and a source electrically connected to the reference power supply line.

23. The driver circuit of claim 22, further comprising:
a third NMOS pull-down transistor having a drain electrically connected to the first current carrying terminal of the first depletion mode transistor; and
a third PMOS pull-up transistor having a drain electrically connected to the first current carrying terminal of the second depletion mode transistor.

24. The driver circuit of claim 23, wherein a gate of said third NMOS pull-down transistor and a gate of said second PMOS pull-up transistor are electrically connected together; and wherein a gate of said third PMOS pull-up transistor and a gate of said second NMOS pull-down transistor are electrically connected together.

25. The driver circuit of claim 21, wherein a gate and the first current carrying terminal of the first depletion mode transistor are electrically coupled together.

26. The driver circuit of claim 25, wherein the first depletion mode transistor is an NMOS depletion mode MOSFET.

27. The driver circuit of claim 24, wherein a gate and the second current carrying terminal of the depletion mode transistor are electrically coupled together.

28. The driver circuit of claim 27, wherein the depletion mode transistor is a PMOS depletion mode MOSFET.

29. The driver circuit of claim 21, wherein the first depletion mode transistor is a buried channel MOSFET.

30. The driver circuit of claim 23, wherein the depletion mode transistor is a buried channel MOSFET.

31. The driver circuit of claim 21, wherein an $I_{dsat}$ characteristic of the first depletion mode transistor has a positive temperature coefficient; and wherein a value of the positive temperature coefficient is sufficient to at least substantially compensate for a reduction in majority carrier mobility in a channel of said first NMOS pull-down transistor that occurs in response to an increase in temperature over a first operating temperature range.

32. An integrated driver circuit, comprising:
a first NMOS pull-down transistor and a first PMOS pull-up transistor connected together in a totem pole arrangement that extends between a positive power supply line and a reference power supply line;
a first driver control circuit having a switchable pull-up path therein that extends between a gate of said first NMOS pull-down transistor and the positive power supply line and comprises a first depletion mode transistor having a first current carrying terminal electrically coupled to the gate of said first NMOS pull-down transistor; and a second driver control circuit having a switchable pull-down path therein that extends between a gate of said first PMOS pull-up transistor and the reference power supply line and comprises a second depletion mode transistor having a first current carrying terminal electrically coupled to the gate of said first PMOS pull-up transistor;

a first capacitor having a first electrode electrically connected to a second current carrying terminal of the first depletion mode transistor and a second electrode electrically connected to the first current carrying terminal of the first depletion mode transistor; and a second capacitor having a first electrode electrically connected to a second current carrying terminal of the second depletion mode transistor and a second electrode electrically connected to the first current carrying terminal of the second depletion mode transistor.

33. The driver circuit of claim 32, wherein the gate of the first NMOS pull-down transistor is not electrically connected to the gate of the first PMOS pull-up transistor.

34. The driver circuit of claim 32, wherein the gate of the first NMOS pull-down transistor is electrically connected to the gate of the first PMOS pull-up transistor.

35. The driver circuit of claim 34, wherein the first current carrying terminal of the first depletion mode transistor is electrically connected to the first current carrying terminal of the second depletion mode transistor.

36. The driver circuit of claim 32, wherein a capacitance of said first capacitor is in a range between about 0.75 and 1.25 times $C_{ideal}$, where $C_{ideal}=|Vth|(Cin)/(Vdd-|Vth|)$, Vth is a threshold voltage of said first NMOS pull-down transistor, Cin is an input capacitance of said first NMOS pull-down transistor and Vdd represents a magnitude of a power supply voltage applied to the positive power supply line; and wherein the input capacitance of said first NMOS pull-down transistor is measured between its gate and its source, drain and body regions.

37. An integrated driver circuit, comprising:
an NMOS pull-down transistor;
an output signal line electrically coupled to a drain said NMOS pull-down transistor; and
a driver control circuit having a switchable pull-up path therein that extends between a gate of said NMOS pull-down transistor and a positive power supply line, said driver control circuit comprising:
a PMOS depletion mode transistor having a first current carrying terminal electrically coupled to the gate of said NMOS pull-down transistor; and
a PMOS pull-up transistor having a drain electrically coupled to a second current carrying terminal of said depletion mode transistor and a source electrically coupled to the positive power supply line.

38. The driver circuit of claim 37, further comprising a second NMOS pull-down transistor having a drain electrically coupled to the first current carrying terminal of said PMOS depletion mode transistor and a source electrically coupled to a reference power supply line.

39. The driver circuit of claim 38, wherein a gate of said second NMOS pull-down transistor and a gate of said PMOS pull-up transistor are electrically connected together and responsive to an input signal.

40. The driver circuit of claim 38, further comprising a capacitor having a first electrode electrically connected to the gate of said NMOS pull-down transistor and a second electrode electrically connected to the second current carrying terminal of said PMOS depletion mode transistor.

41. The driver circuit of claim 40, wherein a gate of said PMOS depletion mode transistor and the second current carrying terminal of said PMOS depletion mode transistor are electrically connected together.

42. The driver circuit of claim 40, wherein said depletion mode transistor is a buried channel depletion mode transistor.

43. An integrated driver circuit, comprising:
an NMOS pull-down transistor;
an output signal line electrically coupled to a drain of said NMOS pull-down transistor;
a driver control circuit having a switchable pull-up path therein that extends between a gate of said NMOS pull-down transistor and a positive power supply line and has a current sourcing characteristic that at least substantially compensates for a reduction in majority carrier mobility in an inversion layer channel of said NMOS pull-down transistor that occurs in response to an increase in temperature over a first operating temperature range; and
a capacitor having a first electrode electrically connected to the gate of said NMOS pull-down transistor and a first point in the switchable pull-up path and a second electrode electrically connected to a second point in the switchable pull-up path.

44. The driver circuit of claim 43, wherein a capacitance of said capacitor is in a range between about 0.75 and 1.25 times $C_{ideal}$, where $C_{ideal}=|Vth|(Cin)/(Vdd-|Vth|)$, Vth is a threshold voltage of said NMOS pull-down transistor, Cin is an input capacitance of said NMOS pull-down transistor and Vdd represents a magnitude of a power supply voltage applied to the positive power supply line.

45. The driver circuit of claim 43, wherein the switchable pull-up path comprises a buried channel depletion mode MOSFET.

46. An integrated driver circuit, comprising:
a first driver transistor;
an output signal line electrically coupled to a first current carrying terminal of said first driver transistor; and
a driver control circuit having a switchable pull-up path therein that extends between a gate of said first driver transistor and a positive power supply line and comprises a depletion mode transistor having a first current carrying terminal electrically coupled to the gate of said first driver transistor, said depletion mode transistor having a temperature dependent $1_{dsat}$ characteristic that meets the following relationship over at least a first portion of an operating temperature range:

$$0.005 \leq \partial l_{dsat}/\partial T \leq 0.015$$

where T designates a temperature (° C.) within the operating temperature range.

47. The driver circuit of claim 46, wherein said first driver transistor comprises an NMOS pull-down transistor having a temperature dependent $1_{dsat(NMOS)}$ characteristic that meets the following relationship over at least a second portion of the operating temperature range:

$$-0.01 \geq \partial l_{dsat(NMOS)}/\partial T \geq -0.015.$$

48. The driver circuit of claim 46, wherein the depletion mode transistor is a buried channel transistor.

49. The driver circuit of claim 48, wherein a peak channel dopant concentration in the depletion mode transistor is at a level of about $1 \times 10^{18}$ cm$^{-3}$ or less.

50. An integrated driver circuit, comprising:
an NMOS pull-down transistor having a temperature dependent $1_{dsat(NMOS)}$ characteristic that meets the relationship: $0 \geq \partial l_{dsat(NMOS)}/\partial T$ over at least a first portion of an operating temperature range, where T designates a temperature (° C.) within the operating temperature range;
an output signal line electrically coupled to a drain of said NMOS pull-down transistor; and
a driver control circuit having a switchable pull-up path therein that extends between a gate of said NMOS pull-down transistor and a positive power supply line and comprises a depletion mode transistor having a first current carrying terminal electrically coupled to the gate of said NMOS pull-down transistor, said depletion mode transistor having a temperature dependent $1_{dsat}$ characteristic that meets the relationship: $0 \leq \partial l_{dsat}/\partial T$ over at least a second portion of the operating temperature range.

51. An integrated driver circuit, comprising:
a first driver transistor;
an output signal line electrically coupled to a first current carrying terminal of said first driver transistor; and
a driver control circuit having a switchable pull-up path therein that extends between a gate of said first driver transistor and a positive power supply line and comprises a PMOS depletion mode transistor having a first current carrying terminal electrically coupled to the gate of said first driver transistor, and a gate and second current carrying terminal that are electrically coupled together.

52. The driver circuit of claim 51, wherein said first driver transistor is an NMOS pull-down transistor; and wherein the switchable pull-up path comprises a PMOS pull-up transistor having a drain electrically coupled to the second current carrying terminal of the PMOS depletion mode transistor.

53. The driver circuit of claim 51, further comprising a capacitor having a first electrode electrically connected to the second current carrying terminal of the PMOS depletion mode transistor and a second electrode electrically connected to the first current carrying terminal of the PMOS depletion mode transistor.

54. The driver circuit of claim 51, wherein the PMOS depletion mode transistor is a buried channel MOSFET.

55. The driver circuit of claim 52, further comprising a capacitor having a first electrode electrically connected to the second current carrying terminal of the PMOS depletion mode transistor and a second electrode electrically connected to the first current carrying terminal of the PMOS depletion mode transistor.

56. The driver circuit of claim 55, wherein a capacitance of said capacitor is in a range between about 0.75 and 1.25 times $C_{ideal}$, where $C_{ideal}=|Vth|(Cin)/(Vdd-|Vth|)$, Vth is a threshold voltage of the NMOS pull-down transistor, Cin is an input capacitance of the NMOS pull-down transistor and Vdd represents a magnitude of a power supply voltage applied to the positive power supply line; and wherein the input capacitance of the NMOS pull-down transistor is measured between its gate and its source, drain and body regions.

* * * * *